Oct. 18, 1966 H. BENDIG 3,280,382

SEMICONDUCTOR DIODE COMPRISING CAUSTIC-RESISTANT SURFACE COATING

Filed Sept. 25, 1961

Inventor:
Hans Bendig
By: George H. Spencer
Attorney

United States Patent Office 3,280,382

Patented Oct. 18, 1966

3,280,382
SEMICONDUCTOR DIODE COMPRISING CAUSTIC-RESISTANT SURFACE COATING

Hans Bendig, Ulm (Danube), Germany, assignor to Telefunken Patentverwertungs-G.m.b.H., Ulm (Danube), Germany Filed Sept. 25, 1961, Ser. No. 140,450
Claims priority, application Germany, Sept. 27, 1960, T 19,052
10 Claims. (Cl. 317—234)

The present invention relates generally to electronic components and more particularly to alloyed semiconductor devices, especially transistors or diodes.

In the high-frequency art, capacitance diodes of the semiconductor type have been used for some time. These capacitance diodes vary in capacitance according to the voltage applied thereto. This effect is predominantly utilized for: tuning oscillation circuits; use as a non-linear member in reactance amplifiers; and frequency multiplying, for example.

However, these known capacitance diodes are not yet of sufficient quality to meet the demands placed upon them. Accordingly it is a main object of the present invention to provide a semiconductor device which is of better quality than those heretofore produced.

In devices of the alloyed type, first the alloying material is applied to the semiconductor surface and alloyed into the latter. After alloying, the metallic portion of the alloying material is electrically connected to a contact element. Then, a continuous caustic-resistant surface coating of good electric conductivity is applied to the metallic portion of the alloying material and to at least a portion of the contacting elements, after which the semiconductor device is etched.

In general, contact elements are understood to mean lead wires, but may also include electrodes which are brought into contact with the lead wires or alloying wires if no alloying pill in the conventional sense is present and if the alloy is formed by an alloying wire which at the same time may be considered a lead wire. If, for example, the alloying is done with an alloying wire and if this alloying wire is connected to a further electrode, the surface coating may extend over the solder between the lead wire or alloying wire and the further electrode, assuming the connection between the lead wire and the further electrode is produced by a soldering process. If an alloying wire is used the metallic portion of the alloying material consists of the portion of the alloying wire which is not alloyed into the semiconductor body.

Additional objects and advantages of the present invention will become apparent upon consideration of the following description when taken in conjunction with the accompanying drawings in which.

Figure 1:
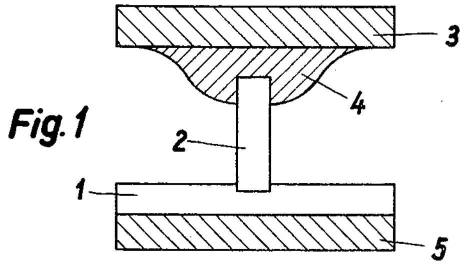
FIGURE 1 is a diagrammatic sectional view through one embodiment of the present invention before completion.

With more particular reference to the drawing, FIGURE 1 shows a capacitance diode of silicon of n-type conductivity, having an aluminium wire 2 alloyed into a semiconductor body 1. Since aluminium produces p-conductivity in silicon, a p-n junction if formed between the silicon body proper and the recrystallization zone produced by alloying. The alloying wire 2 may be considered part of the electrode supply line.

However, it is necessary to connect the aluminium wire 2 with an electrode 3 via which current may be supplied to the diode. The connection between the wire 2 and the electrode 3 is preferably produced by a soldering operation using solder 4. A further electrode 5 is provided as a base electrode. The thickness of the semiconductor body is, in general, selected to be as small as possible. Between the p-n junction and the base electrode 5, it should be equal to or only slightly larger than the maximum extension of the blocking layer in the modulated state.

Figure 2:
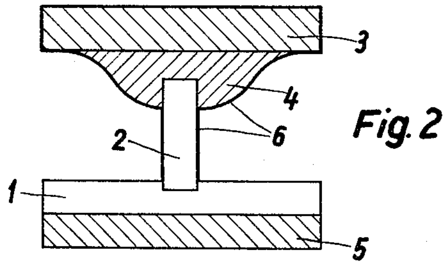
FIGURE 2 is a diagrammatic sectional view of the FIGURE 1 device after application of the surface coating.

Before the capacitance diode is subjected to an etching process, a thin continuous gold layer 6, shown in FIGURE 2, is electrolytically applied to the portion of metallic part 2 disposed above the semiconductor surface and, preferably, also to the surface of the solder 4 and to the electrode 3. Before electroplating the device is immersed in a degreasing bath consisting for example of $CCl_4$. In order to remove the undesired aluminium-oxide-layer, the device, after degreasing, is immersed in an etching bath consisting for example of sodium hydroxide and a solution of zinc-salt. The gold-plating is carried out electrolytically in a gold-bath. The thickness of the gold layer is about 2 microns. Instead of gold other noble metals can be used also as for example platinum or rhodium. Due to its low electric conductivity, the semiconductor surface does not take part in the galvanic action. The two electrodes 3 and 5 may also be constructed to be of the shape shown in FIGURE 3 and may be connected with one another by an insulating ring 7 of suitable material, as, for example, quartz. The material of the connecting ring 7 must be caustic-resistant. The electrode 3, with which the wire 2 comprising the alloying material (an aluminium wire in the embodiment) is brought into contact, is perforated, i.e., is provided with bores or holes at one or several locations. This is also advisable for the electrode 5 onto which the semiconductor body 1 is placed. These bores in the upper electrode 3 and, in general, also in the lower electrode 5 serving as a carrier plate for the semiconductor body, admit the electrolyte to treat the points which would otherwise be omitted during both the galvanic process and the etching process. The use of perforated electrodes and the housing connected therewith is not confined to the process according to the invention but may be used elsewhere.

Figure 4:
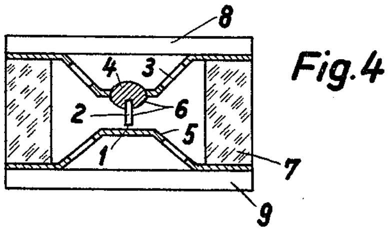
FIGURE 4 is a diagrammatic sectional view of the FIGURE 3 device with housing caps connected thereto.

For the etching step, a chemical etching process using a caustic liquid of hydrofluoric acid and nitric acid may be used. The etching process is terminated when the desired amount of semiconductor material has been removed. In the manufacture of capacitance diodes for high frequency use, some of the semiconductor material is generally removed so as thereby to reduce the capacitance of the diode. It is even advisable, as shown in FIGURE 4, to remove the entire semiconductor body 1 until all that remains is a small path the size of the diameter of the p-n junction. The existence of the surface coating 6 makes possible such a removal of semiconductor material and also assures that the currents flowing through the diode, after passing the p-n junction, find surfaces of good electrical conductivity.

Figure 3:
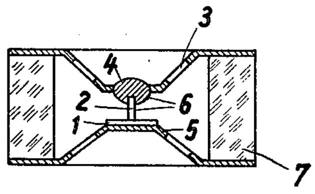
FIGURE 3 is a diagrammatic sectional view of another embodiment of the invention.

The ring 7, connecting the two electrodes 3 and 5 with one another, comprises part of the housing, namely, the housing wall. Vacuum tight sealing of the housing is accomplished in the embodiment of FIGURE 4, by placing housing caps 8 and 9 onto the connecting ring 7 on both sides thereof, after the etching process. In the embodiment of FIGURES 3 and 4, the two electrodes 3 and 5 are of conical design.

Although the invention has been illustrated using an example of a capacitance diode, the invention is not confined to capacitance diodes but may be used generally in semiconductor devices.

It will be understood that the above description of the present invention is susceptible to various modifications, changes, and adaptations, and the same are intended to be comprehended within the meaning and range of equivalents of the appended claims.

What is claimed is:

1. An alloyed semiconductor device comprising, in combination:

(a) a semiconductor body;

(b) a mass of alloying material constituted by an alloying wire and having a metallic portion and an alloyed portion which is alloyed into a surface of said semiconductor body;

(c) a first contact element conductively connected to said metallic portion;

(d) a solder mass conductively connecting said contact element to said metallic portion; and (e) a continuous caustic-resistant surface coating of good electrical conductivity covering said metallic portion, said solder mass and a portion of said element.

2. An alloyed semiconductor device as defined in claim 1, wherein said semiconductor body is a silicon body of n-type and said wire is of aluminium.

3. An alloyed semiconductor device as defined in claim 1, wherein said surface coating is made of gold.

4. An alloyed semiconductor device as defined in claim 1, wherein said surface coating is made of a noble metal selected from the group consisting of gold, platinum, and rhodium.

5. An alloyed semiconductor device as defined in claim 1, wherein said contact element is perforated.

6. An alloyed semiconductor device as defined in claim 1, wherein there is a pn-junction between said body and said alloyed portion and the cross section of said conductor body is equal to the cross section of said pn-junction.

7. An alloyed semiconductor device comprising, in combination: a semiconductor body; a mass of alloying material having a metallic portion and an alloyed portion which is alloyed into a surface of said semicondutor body; a first contact element conductively connected to said metallic portion; a continuous caustic-resistant surface coating of good electrical conductivity covering said metallic portion and a portion of said first contact element; and a second contact element having a flat base portion conductively connected to said body and a frusto-conical portion joined, at its small end, to said flat base portion and having at least one opening therein; and wherein said first contact element has a flat base portion conductively connected to said metallic portion and a frusto-conical portion joined, at its small end, to said flat base portion, said frusto-conical portions of said two contact elements opening outward away from each other.

8. An arrangement as defined in claim 7 further comprising a ring of insulating material disposed around said body and said mass of alloying material and mounted between the outer ends of said frusto-conical portions of said two contact elements.

9. An arrangement as defined in claim 8 wherein each of said contact elements further has an annular portion joined to the large end of its respective frusto-conical portion and contacting said ring of insulating material.

10. An arrangement as defined in claim 9 further comprising two housing caps each disposed at one end of said ring and mounted on a respective one of said annular portions for hermetically sealing said semiconductor device.

References Cited by the Examiner

UNITED STATES PATENTS

| | | | |
|---|---|---|---|
| 2,588,956 | 3/1952 | Brittain | 317—236 |
| 2,671,156 | 3/1954 | Douglas et al. | 317—239 |
| 2,694,168 | 11/1954 | North | 317—235 |
| 2,745,044 | 5/1956 | Lingel | 317—234 |
| 2,756,374 | 7/1956 | Colleran | 317—235 |
| 2,792,538 | 5/1957 | Pfann | 317—235 |
| 2,829,422 | 4/1958 | Fuller | 317—235 |
| 2,898,668 | 8/1959 | Knott et al. | 29—25.3 |
| 2,900,531 | 8/1959 | Wallmark | 317—235 |
| 2,903,628 | 9/1959 | Giacoletto | 317—235 |
| 2,945,922 | 7/1960 | Bollert | 317—234 |
| 3,030,693 | 4/1962 | Faskerty | 29—25.3 |
| 3,065,390 | 11/1962 | Boswell et al. | 317—234 |

JOHN W. HUCKERT, *Primary Examiner.*

JACOB STEINBERG, W. A. POWELL, J. D. KALLAM, *Assistant Examiners.*